United States Patent

Prinz

[11] Patent Number: 5,969,978
[45] Date of Patent: Oct. 19, 1999

[54] READ/WRITE MEMORY ARCHITECTURE EMPLOYING CLOSED RING ELEMENTS

[75] Inventor: Gary A. Prinz, Alexandria, Va.

[73] Assignee: The United States of America as represented by the Secretary of the Navy, Washington, D.C.

[21] Appl. No.: 09/163,333

[22] Filed: Sep. 30, 1998

[51] Int. Cl.⁶ .................................................. G11C 17/02
[52] U.S. Cl. ............................ 365/98; 365/100; 365/173
[58] Field of Search ................................ 365/185.05, 98, 365/97, 100, 173; 257/531, 295

[56] References Cited

U.S. PATENT DOCUMENTS

| 5,329,486 | 7/1994 | Lage ........................................... 365/66 |
| 5,541,868 | 7/1996 | Prinz .......................................... 365/98 |

Primary Examiner—Vu A. Le
Attorney, Agent, or Firm—Thomas E. McDonnell; John J. Karasek

[57] ABSTRACT

A memory architecture for a regular array of non-volatile ferromagnetic random access annular memory elements which can be based on the giant magnetoresistance (GMR) effect. A first sense row in the array connects the memory elements with strips which are staggered so that each memory element is connected through its upper surface to the memory element on one side and through the lower surface to one on the other side. Running transverse to the first sense row is a word line made up of a series of wires passing in magnetic field producing proximity to the memory elements along a column of the array and not being in electrical contact with the memory elements. The strips of the word line are staggered so they similarly produce a meandering conductive pathway through the word line from one side of the array to the other in series. The wires of the word line can pass through the open core of the annular element or the wires can pass adjacent to the memory elements. A third addressing mechanism in the form of an additional bit line provides added flexibility for the magnetic switching. The bit line is arranged parallel to the sense row and the strips of the bit line are again staggered so that each wire is connected through its top contact to the wire on one side and through its bottom contact to the wire on the other side. This bit line can be used in combination with or in place of the sense row for magnetic switching when it is further used in combination with the word line. Magnetic switching can be done by the word line and the bit line without using the sense line current. In a further embodiment the memory element has an insulative nonmagnetic memory layer so the memory element becomes a magnetic tunnel junction.

20 Claims, 2 Drawing Sheets

READ/WRITE MEMORY ARCHITECTURE EMPLOYING CLOSED RING ELEMENTS

BACKGROUND OF THE INVENTION

1. Field of the Invention

This invention relates to ferromagnetic memory and more specifically to ferromagnetic memory utilizing giant magnetoresistance and spin polarization in annular memory elements.

2. Description of the Related Art

In U.S. Pat. No. 5,541,868 an annular GMR-based memory element is disclosed. The description tells how to construct a magnetic memory element using the giant magnetoresistance effect with the current passing perpendicular to the plane of the device. The disclosure does not, however, describe an optimal circuit architecture employing those elements, nor does it discuss how many different approaches to reading and writing may be realized by employing different supporting circuits.

3. Objects of the Invention

It is an object of this invention to provide a magnetic random access memory which is scalable to greater than 1 gigabit/cm$^2$ density.

It is a further object of this invention to provide a magnetic random access memory which has fast switching elements which are capable of switching at less than 10 nanoseconds.

It is a further object of this invention to provide a magnetic random access memory which has a wide temperature tolerance of from −150° C. to +150° C.

It is a further object of this invention to provide a magnetic random access memory which can be made by a low cost fabrication technique such as sputtered metal films on silicon.

It is a further object of this invention to provide a magnetic random access memory with a bit line in addition to a sense line and a word line to add flexibility to the magnetic switching and bit addressability.

It is a further object of this invention to provide a magnetic random access memory which has a bit line in addition to a sense line and a word line so that the current through the sense line is not needed for manipulating the magnetic state of the memory element.

These and further objects of the invention will become apparent as the description of the invention proceeds.

SUMMARY OF THE INVENTION

This invention relates to an architecture that can be expressed in many different embodiments. The memory architecture of the invention can have a regular array of annular memory elements based on the giant magnetoresistance (GMR) effect as described in U.S. Pat. No. 5,541,868, the entire contents of which is incorporated herein by reference. The addressable array of non-volatile ferromagnetic random access annular memory elements is made up of at least two addressing rows. A first sense row in the array contains at least two non-volatile ferromagnetic random access memory elements. Each of the memory elements has an upper and lower surface with at least a first and second ferromagnetic ring where one of the rings is hard or antiferromagnetically-pinned and the other ring is magnetically softer than the first ring. A non-magnetic layer, which is conductive in the first embodiment, is sandwiched between the first and second ferromagnetic rings. A first conducting lead in the sense row is made up of a series of conductive strips where each of the strips connects two adjacent memory elements at either their upper surfaces or at their lower surfaces, except at the ends of a sense row. The strips of the sense line are staggered so that each memory element is connected through its upper surface to the memory element on one side, and through its lower surface to the memory element on the other side. This produces a vertically meandering conductive pathway through the sense line from one side of the array to the other in series containing as many elements as desired.

The other required element in this first embodiment is a first word line transverse to the first sense row and made up of a series of wires passing in magnetic field producing proximity to the memory elements along a column of the array and not being in electrical contact with the memory elements. A second conducting lead in the word line is made up of a series of conductive strips along the first word line of the array where each of the strips connects two adjacent wires at either their top contacts or at their bottom contacts. The strips of the word line are staggered so that each wire is connected through its top contact to the wire on one side and through its bottom contact to the wire on the other side. This again produces a vertically meandering conductive pathway through the word line from one side of the array to the other in series. The word line defines a conductive path for flowing a current through the wire passing in magnetic field producing proximity to the memory elements and the conductive paths in both the sense line and the word line are perpendicular to the closed magnetic circuits in the ferromagnetic rings.

The memory elements in the addressable array can be annular and have an open core which permits the wires of the word line to pass through. Alternatively, the wires of the word line can pass adjacent to the memory elements. In this alternative embodiment where the wires pass adjacent to the memory elements each wire of the word line can pass either adjacent to a single memory element or it can pass between two adjacent memory elements.

A second embodiment for the addressable array provides a third addressing mechanism in the form of a bit line to add flexibility to the magnetic switching. A first bit line is parallel to the sense row and it is made up of a series of wires passing in magnetic field producing proximity to the memory elements along a column of the array and it is not in electrical contact with the memory elements. A third conducting lead in the bit line is made up of a series of conductive strips along the first bit line of the array where each of the strips connects two adjacent wires at either their top contacts or at their bottom contacts. The strips of the bit line are again staggered so that each wire is connected through its top contact to the wire on one side and through its bottom contact to the wire on the other side. This produces a vertically meandering conductive pathway through the bit line from one side of the array to the other in series. The bit line defines a conductive path for flowing a current through the wire passing in magnetic field producing proximity to the memory elements and the conductive paths are perpendicular to closed magnetic circuits in the ferromagnetic rings. Each of the wires of the bit line can pass either adjacent to a single memory element or it can pass between two adjacent memory elements. This bit line can be used in combination with or in place of the sense row for magnetic switching when used in further combination with the word line. By using the word line and the bit line it is possible to do the magnetic switching without using the sense line current.

In a third embodiment the nonmagnetic memory layer is made of an insulative material and the memory element becomes a magnetic tunnel junction.

DESCRIPTION OF THE PREFERRED EMBODIMENTS

Figure 1:
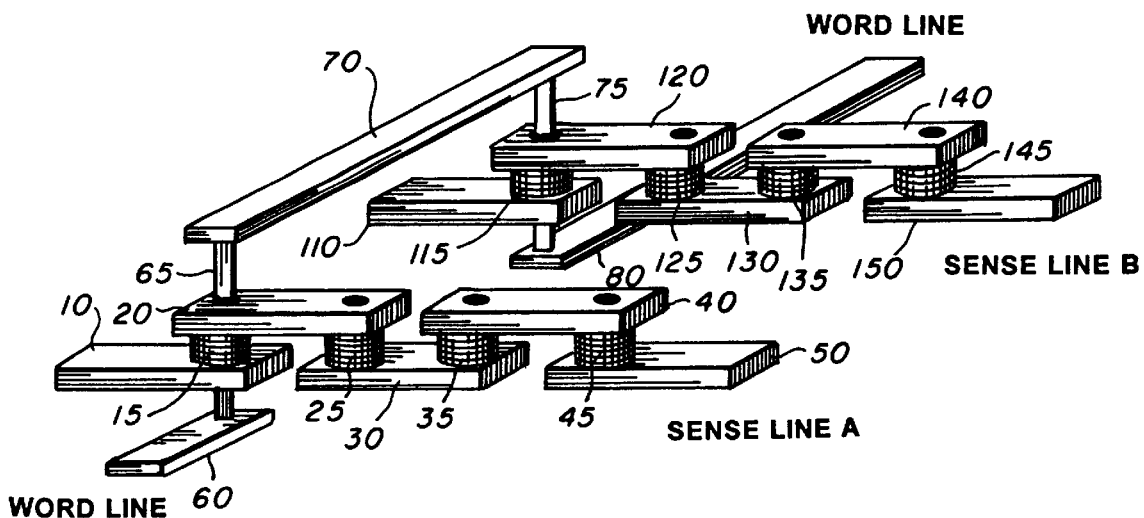
FIG. 1 is a schematic view of an array showing two sense lines and a single word line in an array where the wires of the write line pass through the holes in the memory elements of the sense line.

FIG. 1 illustrates the basic layout of an array of the sense and word lines for a first embodiment of the invention where the word lines have wires which pass through the memory element. A first sense line A is made up of a series of vertically meandering lower and upper sense line strips 10, 20, 30, 40 and 50. The illustrated line begins with the lower strip 10 upon which is placed the memory element 15 and a upper sense line strip 20. A hole is formed through this sandwiched construction through which a work line wire 65 (to be discussed infra) can subsequently pass. Continuing on with the sense line, the opposite end of upper sense line strip 20 has another memory element 25 placed below it and below that is the third sense line strip 30. Again a hole is formed through this construction to permit a word line wire to pass through. The meandering sense line construction continues with a memory element 35 placed at the opposite end of sense line strip 30 and then an upper sense line strip 40 is positioned on top. At the opposite end of the upper sense line strip 40 another memory element 45 is placed below which is connected to the next lower sense line strip 50. A second sense line B is arranged in a parallel fashion and has the same repeating structure as in sense line A.

The word lines are generally arranged perpendicularly to the parallel array of sense lines. The first word line illustrated is made up of a first lower word line strip 60 and it is electrically connected to the next meandering upper word line strip 70 by a wire 65 that passes through the opening in three component structure of the sense line strip 10, the memory element 15 and the upper sense line strip 20. The upper word line strip 70 extends over to the next sense line B and a connecting wire 75 passes down through an opening in the three component structure of the sense line strip 120, the memory element 115 and the lower sense line strip 110. The wire 75 connects with the lower word line strip 80 which extends on to engage with the next sense line in the array.

When writing to the array to store information, the sense lines and word lines are each adapted for carrying a writing current that will have an associated writing field. For both the word line and the sense line, the field that is associated with these writing currents is less than the field $B_w$ that is required to flip the state of the memory elements, but when added together are $\geq B_w$. For example, both the sense line and the word line may carry a writing current that has an associated field of $B_w/2$. To write to a particular memory element, a writing current pulse is sent through both the sense line and the word line. At the memory element where these lines intersect, the local field is high enough to flip the state of the memory element, but elsewhere along the word line and the sense line the field is not high enough to flip the state of these memory elements.

The sense lines and word lines are also adapted for carrying a reading current that are less than the currents required to flip the state of the memory elements. As a reading current is sent through the sense line, a low current pulse is sent through the word line. By monitoring the resistance across the sense line as the current pulse is applied through the word line, one can monitor whether the word line pulse partially flips the state of the element, thus indicating the state of the memory element. This is carried out in a differential mode of operation by using a bipolar signal applied to the word line. For example, a positive pulse is first applied, followed by a negative pulse. If the soft magnetic layer is already set in a positive direction, it will not respond to a positive pulse, but will respond to the following negative pulse. Conversely, if the soft layer had been set in a negative direction, it will respond to the positive pulse, but not the following negative pulse. Thus, the phase of the output response signal to the bipolar word line pulses, will reveal the sense of polarization of the soft layer.

In the first embodiment above, the word wire passes through the hole in the memory element. While this is a preferred embodiment, there are problems with using this configuration when one wants to maximize the number of memory elements on a chip. As one attempts to add more and more elements on a chip, their size must become smaller and smaller. As the size of the circular memory elements are made very small, the size needed for the hole in the element to accommodate the insulated wire becomes a significant amount of the cross-section of the memory element such that the memory element can not be made any smaller. For example, if the smallest lithograhic feature can have a dimension $\lambda$, then the hole will be of this dimension. If the annular insulating layer lining the hole has a thickness $\lambda$ and the annular magnetic ring also has a thickness $\lambda$, then the overall memory element will have a diameter of $5\lambda$. One solution to this problem is illustrated in FIG. 2.

Figure 2:
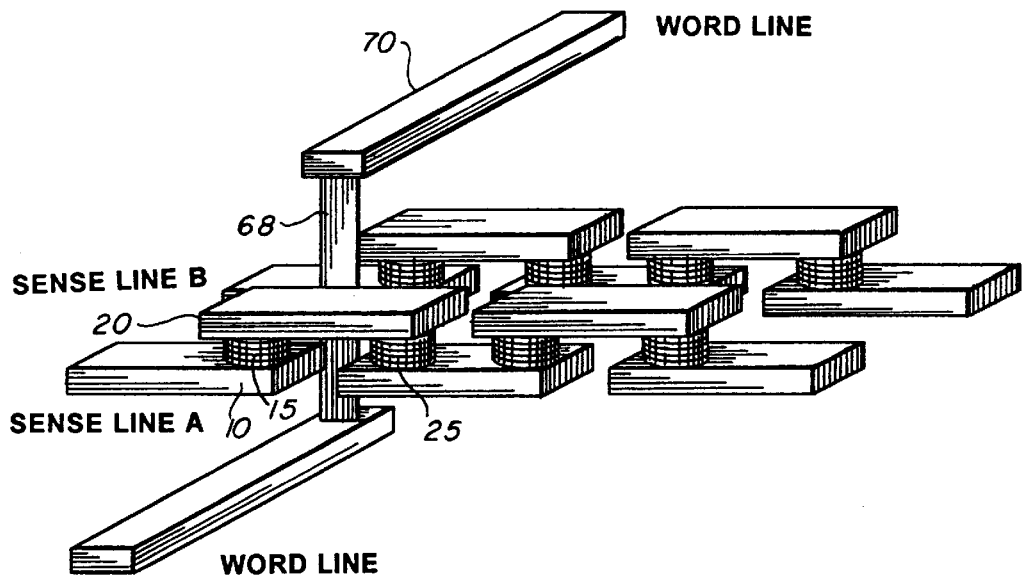
FIG. 2 illustrates an embodiment where the wire of the word line does not pass through the memory element and can be used between two memory elements.

In FIG. 2 the same circuit elements have the same legends as in FIG. 1. The key difference is that in this embodiment instead of having the vertical word wire 65 of FIG. 1 passing through the upper sense line strip 20, the memory element 15, and the lower sense line strip 10, the word line wire vertical wire 68 passes vertically through in a region spaced from the first sense line A. The wire 68 can either be positioned adjacent the memory element 15 (i.e. so it affects just one memory element 15) or to economize on the number of word lines needed, it can be placed between two memory elements such as 15 and 25 as illustrated in the FIG. 2 so that it will affect the magnetization in both of these magnetic memory elements.

Figure 3:
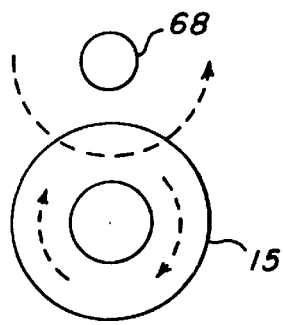
FIG. 3 illustrates how a current through a word line wire outside of a memory element induces a magnetic field in the memory element.

FIG. 3 illustrates how a current through a word line wire outside of a memory element induces a magnetic field in the memory element. The memory element 15 is illustrated as an annular element having a hollow core, but it can also be in a solid disk form as seen in FIG. 2. The word wire 68 shown above the memory element 15 induces a magnetic field in the memory element as seen by the counterclockwise field line surrounding the wire 68. This will add to the clockwise field induced in memory element 15 by the current flowing through the sense line.

Figure 4:
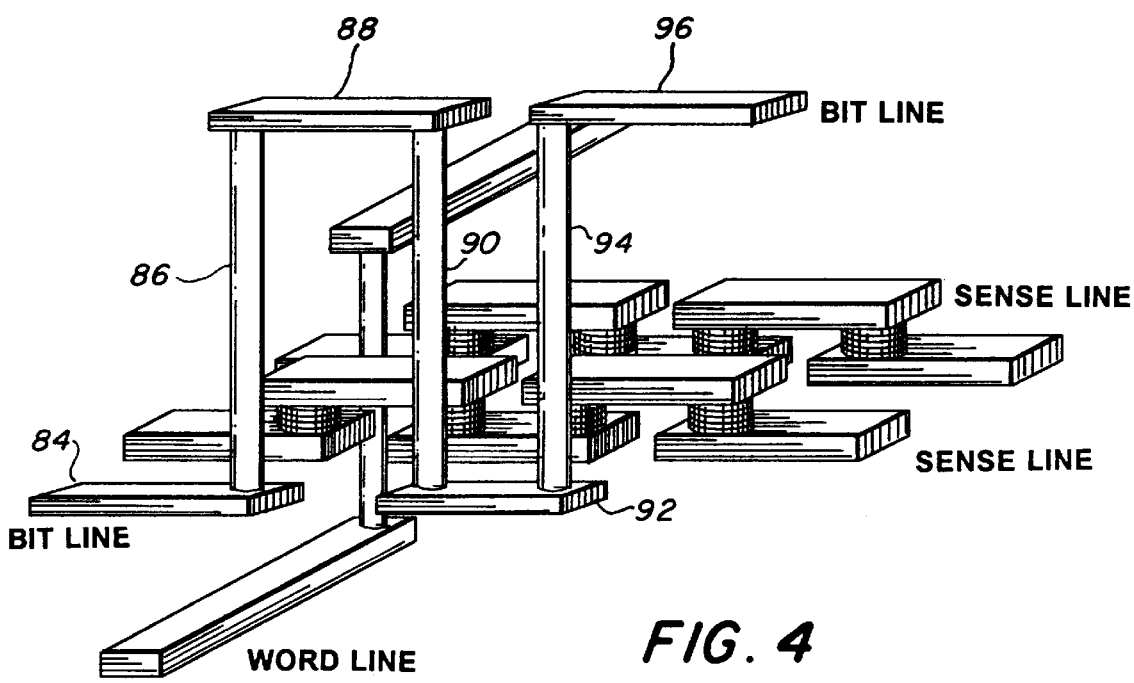
FIG. 4 illustrates an embodiment having a further bit line to switch the memory element.

Another embodiment is shown in FIG. 4 which further uses a bit line in addition to the word and sense line. By using two posts, one for a word line and one for a bit line, it does not require current through the sense line to actually assist in switching the elements. In FIG. 4 the bit line height is exaggerated so that it can be better seen, but in actual fabrication it would have the same height as the sense line. Again the same circuit elements have the same legends as in FIG. 1. The additional bit line, as a portion is illustrated in FIG. 4, is made up of a lower bit line strip 84, a vertical wire 86, an upper bit line strip 88, a vertical wire 90, a lower bit line strip 92, a vertical wire 94, and an upper bit line strip 96. In this illustrated embodiment each of the vertical wires of the bit line is adjacent a single memory element. However, it would be possible to place one between every other memory element as illustrated for the word line in FIG. 2. In FIG. 4 the word line is arranged as in FIG. 2 so that it is between every two memory elements. Again, it would also be possible to have the word line arranged as in FIG. 1 where the vertical wires are associated with an individual memory element. The advantage of this array in FIG. 4 is that it separates the functions so that the current through the sense line is only needed for sensing, not for manipulating the magnetic state of the memory element. This approach is useful when using high resistance elements for memory storage, such as magnetic tunnel junctions, which do not allow sufficient current conductance to generate the magnetic fields necessary for manipulating the magnetic state of the memory element.

An example of magnetic tunnel junctions is discussed in U.S. Pat. No. 5,629,922 to Moodera et al. entitled "Electron Tunneling Device Using Ferromagnetic Thin Films."

Figure 5:
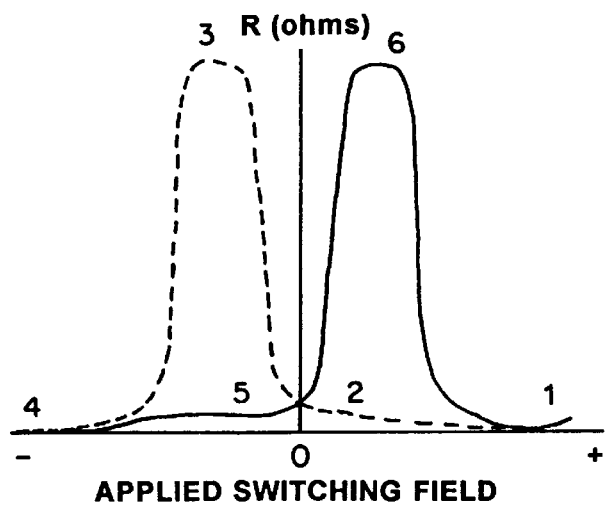
FIG. 5 illustrates an ideal response time of an individual magnetic element.

The resistance of an individual magnetic storage element can be manipulated by manipulating the relative directions of the magnetization of its individual magnetic components. An ideal response time for an individual magnetic element is shown in the FIG. 5 which displays the magnetoresistance (vertically) versus the applied field (horizontally). If the element has been subjected to sufficiently high magnetic fields to align the magnetization of both the hard layers and the soft layers with respect to each other, the element is in the state labeled (1) on the response curve. As the applied field is lowered to zero the magnetoresistance follows the dashed line to the point (2) remaining at a low value of resistance. When the magnetic field is again applied, but now in the opposite direction, the resistance continues to follow the dashed curve to point (3). This is the maximum resistance of the element when the soft and hard layers are anti-aligned and occurs because the soft layers have reversed the direction of their magnetization. Continuing to increase the applied field in the negative direction carries one along the dashed curve to (4) which occurs when the hard magnetic layers have also reversed their direction from that in the starting state of (1) and they are now aligned with the magnetization of the soft layers, but they are both reversed from what they were in state (1). This cycle can now be reversed by following the solid curve to (5) by lowering the applied field to zero; to (6) by applying sufficient positive field to reverse only the soft layers, leaving them anti-aligned with the hard layers; and finally returning to (1), the original state, where both hard and soft layers are aligned. An optimum curve possesses a broad plateau at points (3) and (6); very sharp vertical transitions; the fields required for the transitions from (2) to (3) or (5) to (6) should be sufficiently low to be readily achieved by currents in lithographic circuits; and the transitions from (3) to (4) and (6) to (1) should be at sufficiently low fields to be generated by currents in lithographic circuits.

For further information on the fabrication of these memory elements, see "Magnetoelectronic Memory: Design and Processing Issues" by Konrad Bussmann, Gary Prinz, Richard Womack, Shufan Cheng, Anita Fink, Dexin Wang and Boris Nadgorny, Proceedings 1997 International Semiconductor Device Research Symposium, pg 477–481 Dec. 10–13, 1997, and the references cited therein.

It is understood that the foregoing detailed description is given merely by way of illustration and that many variations may be made therein without departing from the spirit of this invention.

What is claimed is:

1. An addressable array of non-volatile ferromagnetic random access annular memory elements, comprising:
    a first sense row in the array of at least two non-volatile ferromagnetic random access memory elements;
        each of said non-volatile ferromagnetic random access memory elements having upper and lower surfaces and including:
            (i) at least a first ferromagnetic ring and a second ferromagnetic ring, wherein one of said ferromagnetic rings is hard or antiferromagnetically-pinned and the other ferromagnetic ring is magnetically softer than said hard or antiferromagnetically-pinned ring; and
            (ii) a non-magnetic layer sandwiched between said first and second ferromagnetic rings;
    a first conducting lead made up of a series of conductive strips along the first sense row of the array,
        each of said strips connects two adjacent memory elements at either their upper surface or at their lower surfaces, except at the ends of a sense row,
        said strips of the sense line being staggered so that each memory element is connected through its upper surface to the memory element on one side, and through its lower surface to the memory element on the other side, whereby a meandering conductive pathway through the sense line from one side of the array to the other in series is formed containing as many elements as desired;
    a first word line transverse to said first sense row, and made up of a series of wires passing in magnetic field producing proximity to the memory elements along a column of the array and not being in electrical contact with the memory elements;
    a second conducting lead made up of a series of conductive strips along the first word line of the array,
        each of said strips connects two adjacent wires at either their top contacts or at their bottom contacts,
        said strips of the word line are staggered so that each wire is connected through its top contact to the wire on one side, and through its bottom contact to the wire on the other side, whereby a meandering conductive pathway through the word line from one side of the array to the other in series is formed;
    said first word line defining a conductive path for flowing a current through the wire passing in magnetic field producing proximity to the memory elements, and
    said conductive paths being perpendicular to closed magnetic circuits in said ferromagnetic rings.

2. An addressable array according to claim 1, wherein the non-magnetic layer sandwiched between the first and second ferromagnetic rings in the memory element is conductive.

3. An addressable array according to claim 2, wherein the memory elements are annular and have an open core and wherein the wires of the word line pass through the open cores of the memory elements.

4. An addressable array according to claim 2, wherein the wires of the word line pass adjacent to the memory elements.

5. An addressable array according to claim 4, wherein each wire of the word line passes adjacent to a single memory element.

6. An addressable array according to claim 4, wherein each wire of the word line passes between two adjacent memory elements.

7. An addressable array according to claim 1, further comprising:
- a first bit line parallel to said first sense row, and made up of a series of wires passing in magnetic field producing proximity to the memory elements along a column of the array and not being in electrical contact with the memory elements;
- a third conducting lead made up of a series of conductive strips along the first bit line of the array,
  - each of said strips connects two adjacent wires at either their top contacts or at their bottom contacts,
  - said strips of the bit line are staggered so that each wire is connected through its top contact to the wire on one side, and through its bottom contact to the wire on the other side, whereby a meandering conductive pathway through the bit line from one side of the array to the other in series is formed;
- said first bit line defining a conductive path for flowing a current through the wire passing in magnetic field producing proximity to the memory elements, and
- said conductive paths being perpendicular to closed magnetic circuits in said ferromagnetic rings.

8. An addressable array according to claim 7, wherein the non-magnetic layer sandwiched between the first and second ferromagnetic rings in the memory element is conductive.

9. An addressable array according to claim 8, wherein the memory elements are annular and have an open core and wherein the wires of the word line pass through the open cores of the memory elements.

10. An addressable array according to claim 8, wherein the wires of the word line pass adjacent to the memory elements.

11. An addressable array according to claim 10, wherein each wire of the word line passes adjacent to a single memory element.

12. An addressable array according to claim 10, wherein each wire of the word line passes between two adjacent memory elements.

13. An addressable array according to claim 8, wherein the wires of the bit line pass adjacent to the memory elements.

14. An addressable array according to claim 13, wherein each wire of the bit line passes adjacent to a single memory element.

15. An addressable array according to claim 13, wherein each wire of the bit line passes between two adjacent memory elements.

16. An addressable array according to claim 7, wherein the non-magnetic layer sandwiched between the first and second ferromagnetic rings in the memory element is insulative.

17. An addressable array according to claim 16, wherein the wires of the bit line pass adjacent to the memory elements.

18. An addressable array according to claim 17, wherein each wire of the bit line passes adjacent to a single memory element.

19. An addressable array according to claim 17, wherein each wire of the bit line passes between two adjacent memory elements.

20. An addressable array according to claim 16, wherein the non-volatile ferromagnetic random access memory element is a magnetic tunnel junction.

* * * * *